(12) United States Patent
Tamegai et al.

(10) Patent No.: US 8,134,106 B2
(45) Date of Patent: Mar. 13, 2012

(54) CURRENT DETECTION CIRCUIT

(75) Inventors: Yoichi Tamegai, Kyoto (JP); Satoru Nate, Kyoto (JP); Isao Yamamoto, Kyoto (JP)

(73) Assignee: Rohm Co., Ltd. (JP)

( * ) Notice: Subject to any disclaimer, the term of this patent is extended or adjusted under 35 U.S.C. 154(b) by 642 days.

(21) Appl. No.: 12/088,172

(22) PCT Filed: Sep. 14, 2006

(86) PCT No.: PCT/JP2006/318288
§ 371 (c)(1),
(2), (4) Date: Mar. 26, 2008

(87) PCT Pub. No.: WO2007/043282
PCT Pub. Date: Apr. 19, 2007

(65) Prior Publication Data
US 2009/0242734 A1    Oct. 1, 2009

(30) Foreign Application Priority Data

Oct. 11, 2005   (JP) .................................. 2005-296719
Oct. 11, 2005   (JP) .................................. 2005-296721
Oct. 11, 2005   (JP) .................................. 2005-296963

(51) Int. Cl.
*G01J 1/32*    (2006.01)
*H01J 40/14*   (2006.01)
*H03K 17/78*   (2006.01)
*H04B 10/00*   (2006.01)
*H04N 3/14*    (2006.01)

(52) U.S. Cl. ............. 250/205; 250/214 R; 250/214 SW; 398/153; 348/308

(58) Field of Classification Search .................. 250/204, 250/205, 214 R, 214.1, 214 A, 214 LA, 214 SW, 250/214 LS; 327/333; 330/288; 398/45, 398/138–140, 145, 153; 348/300–311
See application file for complete search history.

(56) References Cited

U.S. PATENT DOCUMENTS 4,614,874 A * 9/1986 Fukuda et al. ............ 250/559.19
4,644,149 A * 2/1987 Tsunekawa et al. ...... 250/214 A
(Continued)

FOREIGN PATENT DOCUMENTS

JP    56-8956 A    1/1981
(Continued)

OTHER PUBLICATIONS

Chinese Office Action for Application No. 200680001765.0 issued Oct. 16, 2009 with English translation.

(Continued)

*Primary Examiner* — Georgia Y Epps
*Assistant Examiner* — Don Williams
(74) *Attorney, Agent, or Firm* — Cantor Colburn LLP

(57) ABSTRACT

A first transistor may be provided on a current path of a photo transistor. The bias current path may include a bias switch and a first bias resistor connected in series and is provided in parallel with a main current path including the phototransistor. A second transistor may configure a current mirror circuit with the first transistor, and generates second current formed by multiplying the first current flowing in the first transistor by a predetermined factor. The second current is charged in the charging capacitor and converted into a voltage. The bias current path turns on prior to the start of light reception of the phototransistor and turns off after a predetermined period has elapsed from the start of light reception of the phototransistor.

23 Claims, 7 Drawing Sheets

U.S. PATENT DOCUMENTS 5,329,115 A * 7/1994 Lim .......................... 250/214 R
7,760,478 B2 * 7/2010 Yang et al. .................. 361/93.1

FOREIGN PATENT DOCUMENTS

| | | |
|---|---|---|
| JP | 6-188835 A | 7/1994 |
| JP | 06-250255 A | 9/1994 |
| JP | 8-278540 A | 10/1996 |
| JP | 9-96562 A | 4/1997 |
| JP | 2000-347253 A | 12/2000 |
| JP | 2001-245212 A | 9/2001 |
| JP | 2002-107789 A | 4/2002 |
| JP | 2002-335133 A | 11/2002 |
| JP | 2004-325409 A | 11/2004 |
| JP | 2005-10366 A | 1/2005 |
| JP | 2005-167157 A | 6/2005 |
| JP | 2005-216984 A | 8/2005 |

OTHER PUBLICATIONS

International Search Report for International Application No. PCT/JP2006/318288 mailed Dec. 19, 2006.
International Preliminary Report on Patentability for International Application No. PCT/JP2006/318288 issued Apr. 15, 2008.
Written Opinion of the International Searching Authority for PCT/JP2006/318288 mailed Dec. 19, 2006.
Office Action for Chinese Patent Application No. 200680001765.0 issued Jun. 23, 2010 with English translation.
Chinese Office Action for Chinese Application No. 200680001765.0 issued Dec. 21, 2010 with English translation.
Notification of Reason(s) for Refusal for Japanese Application No. 2005-296719 dispatched Mar. 8, 2011 with English translation.
Notification of Reason(s) of Refusal for Japanese Patent Application No. 2005-296719, drafted Sep. 8, 2011 with English translation.
Japanese Office Action, Notification of Reason(s) for Refusal for Japanese Patent Application No. 2005-296721 mailing date of Oct. 4, 2011 with English translation.
Notification of Reason(s) for Refusal for Japanese Patent Application No. 2005-296963, dispatched Nov. 8, 2011, with English translation.

* cited by examiner

CURRENT DETECTION CIRCUIT

CROSS REFERENCE TO RELATED APPLICATIONS

This is a U.S. national stage of application No. PCT/JP2006/318288, filed on 14 Sep. 2006. Priority under 35 U.S.C. §119(a) and 35 U.S.C. §365(b) is claimed from Japanese Application No. 2005-296719, filed 11 Oct. 2005, Japanese Application No. 2005-296721, filed 11 Oct. 2005, and Japanese Application No. 2005-296963, filed 11 Oct. 2005 the disclosure of which is also incorporated herein by reference.

BACKGROUND OF THE INVENTION

1. Field of the Invention

The present invention relates to a current detection circuit for detecting current flowing in a light receiving device and a light emission controller for controlling light emission of a light emitting device.

2. Description of the Related Art

In various kinds of electronic equipment, light incident from outside is measured and signal processing in response to the measured amount of received light is performed. As an example, a light receiver such as an illuminance sensor and an infrared remote control is cited. As a light receiving device for receiving light, a phototransistor, photodiode, CCD (Charge Coupled Device), and so on are widely used.

The phototransistor and the photodiode output current in response to the amount of received light. Therefore, the light receiver performs signal processing by amplifying or voltage-converting the current flowing these light receiving devices. For example, in Patent Document 1, a light receiver as an infrared remote sensor is disclosed and a configuration of a light receiving circuit is disclosed in FIG. 3 thereof. Further, in Patent Document 2, a configuration of a light receiving circuit using an operational amplifier is disclosed.

Also, in various kinds of electronic equipment, light incident from outside is measured and signal processing in response to the measured amount of received light is performed. As an example of the signal processing, light emission control of a camera flash is cited. Specifically, light emitted from a flash and reflected by a subject is measured, and, when the reflected light reaches a predetermined level, the flash (hereinafter, also referred to as a light emitting device) is turned off. In Patent Document 3, a related technology is described.

[Patent Document 1] Japanese Patent Application Laid-open No. H6-188835
[Patent Document 2] Japanese Patent Application Laid-open No. 2005-216984
[Patent Document 3] Japanese Patent Application Laid-open No. 2005-10366

Problem 1

In such a light receiver, there are cases where the amount of received light is desirably detected only with predetermined timing. As an example, the emission control of a flash in a camera or cellular phone terminal with camera will be considered. Regarding the light emission time of the flash, control is performed in a manner that the light illuminated by the flash on and reflected from a subject to be imaged and returned is detected and, when a predetermine amount of light is reflected, the light emission of the flash is stopped. Accordingly, if the detection of light is performed before the flash emits light, sunlight or fluorescent light that should not be measured are also measured, and thus, a problem that accurate light emission control can not be performed arises.

Problem 2

Further, in such equipment, the case where a light receiving device such as a phototransistor or photodiode for generating photocurrent in response to the amount of received light is used for receiving reflected light will be considered. To perform the above-described light emission control using these light receiving devices, a technique of integrating the photocurrent and stopping the light emission when it reaches a predetermined value is conceivable. Here, as a technique of easily integrating photocurrent, there is a method of flowing photocurrent in a capacitance for charging. In this case, the electric potential appearing in the capacitance is compared to a threshold voltage and the light emitting device is turned off according to the comparison result.

However, after the potential appearing in the capacitance reaches the threshold voltage, sometimes the potential drops due to discharge or the like or varies by the influence of noise. In this case, when the potential appearing in the capacitance drops below the threshold voltage, the light receiving device emits light again. Then, when the potential appearing in the capacitance by the re-light-emission reaches the threshold voltage, the light emission is stopped again, and thus, the emission and non-emission may be repeated.

SUMMARY OF THE INVENTION

The invention has been achieved in view of the problems, and one general purpose thereof is to provide a current detection circuit usable in a light receiver that receives light with predetermined timing and capable of stable current detection.

Further, another general purpose is to provide a light emission controller capable of reliably stopping light emission of a light emitting device.

Means 1

An embodiment of the invention relates to a current detection circuit for detecting current flowing in a light receiving device connected to a detection terminal. The current detection circuit includes: a first transistor which is provided on a current path of the light receiving device; a bias current path which is provided in parallel with a main current path including the light receiving device and is on-off controllable; and a second transistor which configures a current mirror circuit with the first transistor and forms output of the current detection circuit by multiplying the current flowing in the first transistor by a predetermined factor. The bias current path turns on prior to the start of light reception of the light receiving device. The bias current path may include a first bias resistor and a bias switch series-connected.

According to the embodiment, current flows in the first transistor by turning on the bias current path prior to the light reception for flowing current. Consequently, the first transistor is biased in the constant current region and the voltage of the detection terminal can be held nearly the constant value, and stable current detection can be performed.

The bias current path may turn off after a predetermined period has elapsed from the start of light reception of the light receiving device. In this case, after the bias current path is turned off, more accurate current detection can be performed because only the current flowing in the light receiving device is detected.

The current detection circuit may further include a latch circuit which latches a control signal in which a signal level varies prior to the start of light reception of the light receiving device for a predetermined period, and an output signal of the latch circuit may be a signal for controlling on and off of the bias current path.

The current detection circuit may further include a second bias resistor which is provided between the first transistor and the detection terminal on the main current path. The circuit may further include a bypass switch which bypasses the second bias resistor, and the bypass switch may turn on prior to the start of light reception of the light receiving device.

The second bias resistor is provided, and thereby, the impedance of the main current path can be made higher in the period prior to the start of light reception and current consumption of the circuit can be reduced.

The current detection circuit may charge the current flowing in the second transistor in a capacitance, convert the current into a voltage, and output the voltage. In this case, the photocurrent generated by the light receiving device may be integrated and output as a voltage.

The current detection circuit may be integrated on one semiconductor substrate. "Integrated" includes the case where all components of the circuit are formed on a semiconductor substrate and the case where main components of the circuit are integrated, and part of resistors, capacitors, or the like may be provided outside of the semiconductor substrate for adjustment of the circuit constant. The current detection circuit is integrated as one LSI, and thereby, the circuit area can be reduced and the characteristics of circuit elements such as transistors and resistors can be kept uniformly.

Another embodiment of the invention is a light receiver. The light receiver includes the above-described current detection circuit and a light receiving device which is connected to the detection terminal of the current detection circuit. The light receiving device may be a phototransistor or phototransistor. According to the embodiment, the current flowing in the light receiving device can be preferably detected and accurate measurement of the amount of received light can be performed.

Still another embodiment of the invention is an electronic equipment. The electronic equipment includes a light emitting device, and the above-described light receiver which detects light emitted from the light emitting device and reflected by an object outside. The light emitting device may stop light emission when an amount of light of reflected light detected by the light receiver reaches a predetermined value.

Means 2

An embodiment of the invention relates to a current detection circuit for detecting current flowing in a light receiving device. The current detection circuit includes: a first transistor which is provided on a current path of the light receiving device; a charging capacitor with a potential at one end fixed; a second transistor which configures a current mirror circuit with the first transistor, multiplies the current flowing in the first transistor by a predetermined factor, and charges the charging capacitor; and a discharge switch which is provided in parallel with the charging capacitor. The discharge switch turns on for a predetermined period prior to the start of light reception of the light receiving device.

According to the embodiment, the discharge switch is turned on before the light to be received by the light receiving device enters, and thereby, charging of the charging capacitor with charge can be prevented, only the current in response to the light to be received can be voltage-converted by the charging capacitor, and the accurate photodetection can be performed.

The current detection circuit may further include a mask switch provided on a current path including the second transistor and the charging capacitor. The mask switch may turn off for a predetermined period prior to the start of light reception of the light receiving device. In the period when the mask switch is off, the current mirror circuit configured by the first transistor and the second transistor is turned off, and the charging path to the charging capacitor is shut. Charging of the charging capacitor by unwanted photocurrent can be prevented and current consumption of the circuit can be reduced.

Turning on and off of the discharge switch and the mask switch may be controlled according to the same signal. The current detection circuit may further include a delay circuit which delays a control signal in which a signal level varies prior to the start of light reception of the light receiving device. The discharge switch and the mask switch may be turned on and off according to an output signal of the delay circuit.

Another embodiment of the invention is a light receiver. The light receiver may include a light receiving device and the above-described current detection circuit which detects photocurrent flowing in the light receiving device. The light receiving device may be a phototransistor or photodiode.

Still another embodiment of the invention is an electronic equipment. The electronic equipment includes a light emitting device, and the above-described light receiver which detects light emitted from the light emitting device and reflected by an object outside. The light emitting device may stop light emission when an amount of light of reflected light detected by the light receiver reaches a predetermined value.

Means 3

An embodiment of the invention relates to a light emission controller for controlling a light emission condition of a light emitting device. The light emission controller includes: a light receiver which is connected to a light receiving device that receives light emitted from the light emitting device and reflected by an object outside, and integrates current in response to photocurrent flowing in the light receiving device and converts the current into a voltage; a comparator which compares the output voltage of the light receiver with a predetermined threshold voltage and outputs a comparison signal that is at a predetermined level when the output voltage is higher than the threshold voltage; and a latch circuit which latches the comparison signal output from the comparator. The light emission controller disables light emission of the light emitting device while the latch circuit is latched by the comparison signal at the predetermined level.

The latch circuit refers to a circuit such as a D-latch circuit, RS-latch circuit, D-flip-flop, and RS-flip-flop that can latch an input signal. According to the embodiment, even when the output voltage of the light receiver fluctuates near the threshold voltage and the comparison signal output from the comparator fluctuates, the light emission condition is controlled according to the signal formed by latching the comparison signal, and thereby, the light emitting device can be prevented from alternating on and off.

The latch circuit may be reset by a control signal for instructing the light emission of the light emitting device. In this case, the light emittable state can be restored at each time when the light emission is instructed.

The latch circuit may be a D-latch circuit with a data terminal at a fixed potential and a clock terminal to which the comparison signal output from the comparator is input. Further, the latch circuit may be a D-flip-flop circuit with a data terminal at a fixed potential and a clock terminal to which the comparison signal output from the comparator is input.

The light emission controller may further include a step-up circuit that generates a drive voltage of the light emitting device.

The light emission controller may be integrated on one semiconductor substrate. "Integrated" includes the case where all components of the circuit are formed on a semiconductor substrate and the case where main components of the circuit are integrated, and part of resistors, capacitors, and the like may be provided outside of the semiconductor substrate for adjustment of the circuit constant.

Another embodiment of the invention is an electronic equipment. The electronic equipment includes a light emitting device, and the above-described light emission controller which controls the light emission condition of the light emitting device. According to the embodiment, the light emission and the stop of light emission of the light emitting device can be stably controlled in the electronic equipment provided with the light emitting device.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
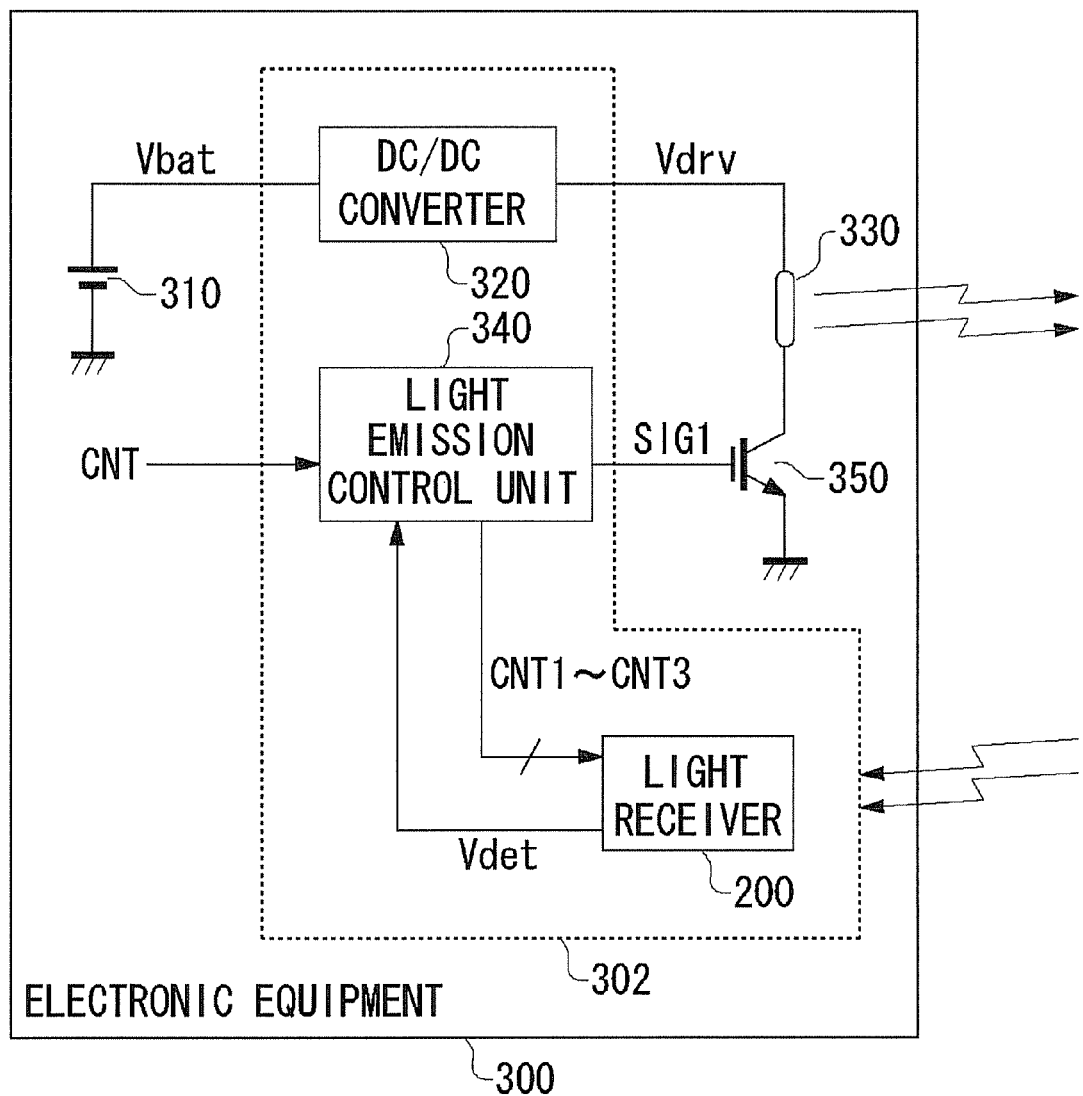
FIG. 1 is a circuit diagram showing a configuration of an electronic equipment according to an embodiment.

FIG. 1 shows a configuration of an electronic equipment 300 according to the embodiment. The electronic equipment 300 according to the embodiment is a cellular phone terminal with camera, for example, and includes a flash. The electronic equipment 300 includes a light receiver which detects light emitted by the flash, reflected, and returned, and stops the light emission of the flash when it detects a predetermined amount of light.

The electronic equipment 300 has a battery 310, a light emission controller 302, a light emitting device 330, and a light emission control transistor 350. The battery 310 is a Li-ion battery or the like, and outputs battery voltage Vbat of about 3 V to 4 V.

The light emission controller 302 is a functional IC that controls the light emission condition of the light emitting device 330, and includes a DC/DC converter 320, a light emission control unit 340, and a light receiver 200. The DC/DC converter 320 is a step-up circuit of switching regulator type, for example, and raises the battery voltage Vbat to about 300 V for driving the light emitting device 330. Drive voltage Vdrv generated by the DC/DC converter 320 is supplied to the light emitting device 330.

The light emitting device 330 is a xenon tube lamp, for example, and the drive voltage Vdrv raised to about 300 V is applied to one end thereof. The light emission control transistor 350 is connected to the other end of the light emitting device 330. As the light emission control transistor 350, an IGBT (Insulated Gate Bipolar Transistor) having high voltage resistor or the like is used. Emission control signal SIG1 output from the light emission control unit 340 is input to the gate of the light emission control transistor 350.

Control signal CNT that synchronizes with the timing of a shutter to reach a high level when a user turns on the flash is input to the light emission control unit 340. The light emission control unit 340 switches the light emission control signal SIG1 to the high level according to the control signal CNT as will be described later. When the light emission control signal SIG1 is at the high level, the light emission control transistor 350 turns on after delay time τ has elapsed and the light emitting device 330 emits light. The delay time τ is determined by the property of the xenon tube lamp.

Further, the light emission control unit 340 generates first to third control signals CNT1 to CNT3 according to the control signal CNT, and outputs the signals to the light receiver 200. The light receiver 200 transits to a stand-by state for receiving light according to the first to third control signals CNT1 to CNT3 output from the light emission control unit 340. Then, the light receiver 200 detects the light emitted from the light emitting device 330, reflected by an external subject to be imaged, and returned, and outputs it as detection voltage Vdet. When the detection voltage Vdet exceeds a predetermined threshold voltage Vth, that is, the detected reflected light reaches a predetermined amount of light, the light emission control unit 340 sets the light emission control signal SIG1 at a low level and stops the light emission of the light emitting device 330.

Figure 2:
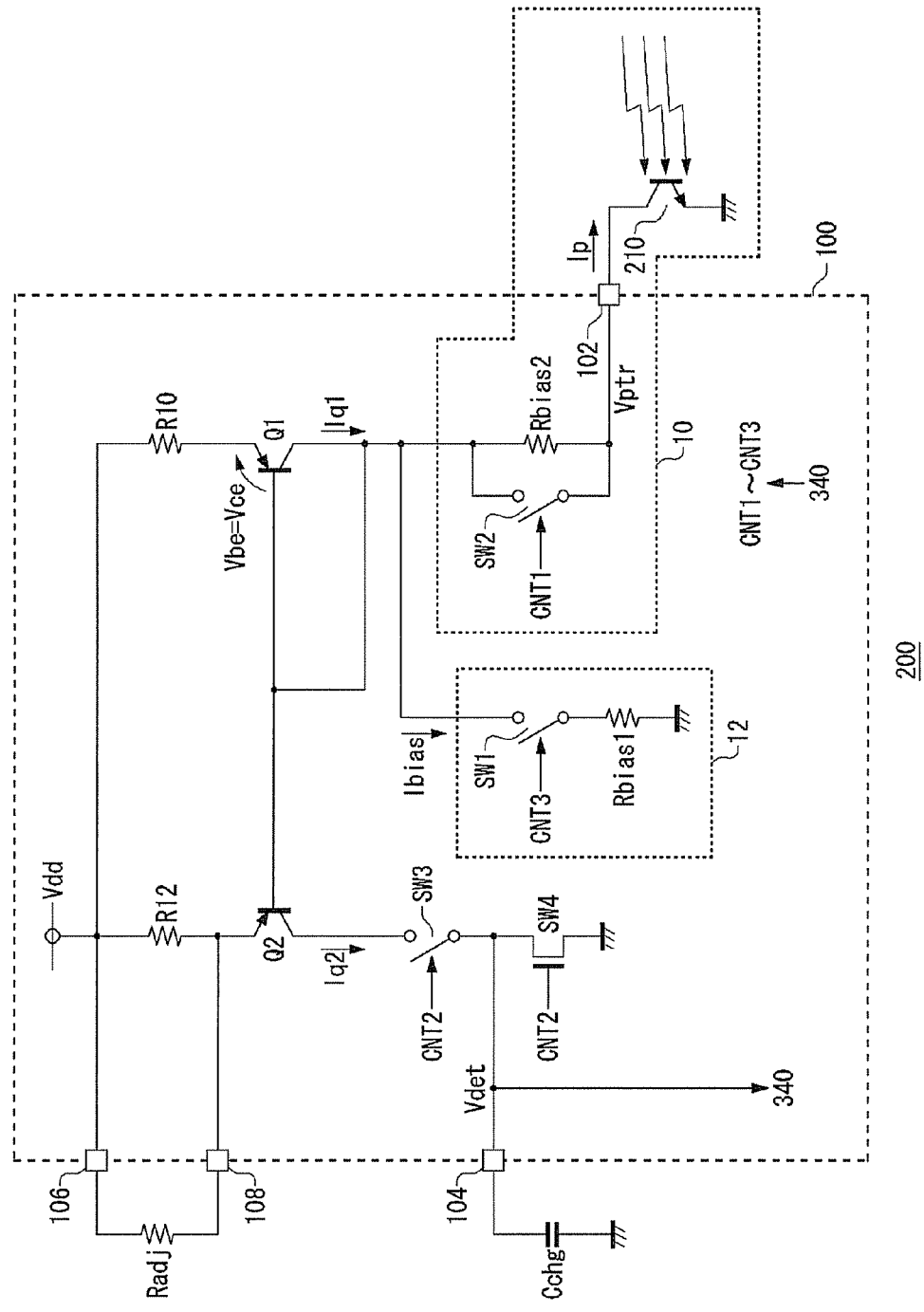
FIG. 2 is a circuit diagram showing a configuration of a light receiver in FIG. 1.

Next, a configuration of the light receiver 200 according to the embodiment will be described in detail. FIG. 2 is a circuit diagram showing the configuration of the light receiver 200 according to the embodiment. The light receiver 200 includes a current detection circuit 100, a phototransistor 210, charging capacitor Cchg, and adjustment resistor Radj. The current detection circuit 100 is an IC integrated on one semiconductor substrate, and integrated with the control circuits of the light emission control unit 340, the DC/DC converter 320 and the like in FIG. 1 as a functional IC in the embodiment.

The phototransistor 210 is provided as a light receiving device, and photocurrent Ip according to the incident light flows therein. The emitter of the phototransistor 210 is grounded and the collector is connected to a detection terminal 102 of the current detection circuit 100.

The current detection circuit 100 detects the photocurrent Ip flowing in the phototransistor 210 connected to the detection terminal 102. The current detection circuit 100 includes first transistor Q1, second transistor Q2, first bias resistor Rbias1, second bias resistor Rbias2, bias switch SW1, bypass switch SW2, first resistor R10, and second resistor R12. Further, the adjustment resistor Radj is connected between a resistor connecting terminal 106 and a resistor connecting terminal 108 and the charging capacitor Cchg is connected to a capacitance connecting terminal 104 outside of the current detection circuit 100.

The first transistor Q1 is a PNP-type bipolar transistor (hereinafter, simply referred to as a PNP transistor), and provided on a current path of the phototransistor 210 as the light receiving device. The first resistor R10 is connected between the emitter of the first transistor Q1 and a power supply line to which power supply voltage Vdd is applied. Further, the base and the collector of the first transistor Q1 are connected.

The second transistor Q2 is a PNP transistor and the first transistor Q1 and the base is commonly connected. The second resistor R12 is provided between the emitter of the second transistor Q2 and a power supply line. Furthermore, the adjustment resistor Radj is connected in parallel with the second resistor R12. The second transistor Q2 forms a current mirror circuit together with the first transistor Q1, the first resistor R10, the second resistor R12, and the adjustment resistor Radj. The second transistor Q2 outputs second current Iq2 formed by multiplying the first current Iq1 by a predetermined factor. For example, the size ratio between the first transistor Q1 and the second transistor Q2 is set to about 4:1.

The path from the collector of the first transistor Q1 via the detection terminal 102 and the phototransistor 210 to the ground is a main current path 10. The second bias resistor Rbias2 is provided between the first transistor Q1 and the detection terminal 102 of the main current path 10. The resistance value of the second bias resistor Rbias2 is set sufficiently high in a range of several MΩ to several tens of MΩ, for example. In the embodiment, the value is set to 10 MΩ as an example. The main current path 10 further has the bypass switch SW2 that bypasses the second bias resistor Rbias2. The bypass switch SW2 controls on and off of the first control signal CNT1 output from the light emission control unit 340.

A bias current path 12 is provided in parallel with the main current path 10. The bias current path 12 includes the first bias resistor Rbias1 and the first bias switch SW1 connected in series between the collector of the first transistor Q1 and the ground. The resistance value of the first bias resistor Rbias1 is set sufficiently lower than the second bias resistor Rbias2 to about a tenth, for example. The resistance value of the second bias resistor Rbias2 is 1 MΩ, for example.

The on and off of the bias switch SW1 is controlled according to the third control signal CNT3 generated by the light emission control unit 340. When the bias switch SW1 turns on, the bias current path 12 turns on and current flows therein. Hereinafter, the current flowing in the bias current path 12 is referred to as bias current Ibias.

The collector of the second transistor Q2 is connected to the capacitance connecting terminal 104 via mask switch SW3. The current detection circuit 100 charges the second current Iq2 flowing in the second transistor Q2 in the charging capacitor Cchg, and converts the current into a voltage. The on and off of the mask switch SW3 is controlled according to the second control signal CNT2 generated in the light emission control unit 340. The mask switch SW3 turns off when the second control signal CNT2 is at the high level and turns on at the low level. When the mask switch SW3 turns off, the path of the second current Iq2 is shut and the charging of the charging capacitor Cchg is stopped.

Discharge switch SW4 is provided between the capacitance connecting terminal 104 and the ground. The discharge switch SW4 is an NMOS transistor and connected in parallel with the charging capacitor Cchg. Regarding the discharge switch SW4, the drain is connected to the capacitance connecting terminal 104, the source is connected to the ground, and the second control signal CNT2 generated by the light emission control unit 340 is input to the gate. The discharge switch SW4 turns on when the second control signal CNT2 is at the high level and turns off at the low level. When the discharge switch SW4 turns on, the capacitance connecting terminal 104 is grounded and the charge accumulated in the charging capacitor Cchg is discharged. As described below, the capacitance connecting terminal 104 turns on for predetermined time ΔT1 according to the second control signal CNT2 prior to the start of light reception of the phototransistor 210. The on and off of the discharge switch SW4 and the mask switch SW3 are controlled according to the same second control signal CNT2.

The current detection circuit 100 according to the embodiment outputs the voltage appearing in the capacitance connecting terminal 104 as the detection voltage Vdet to the light emission control unit 340.

Figure 3:
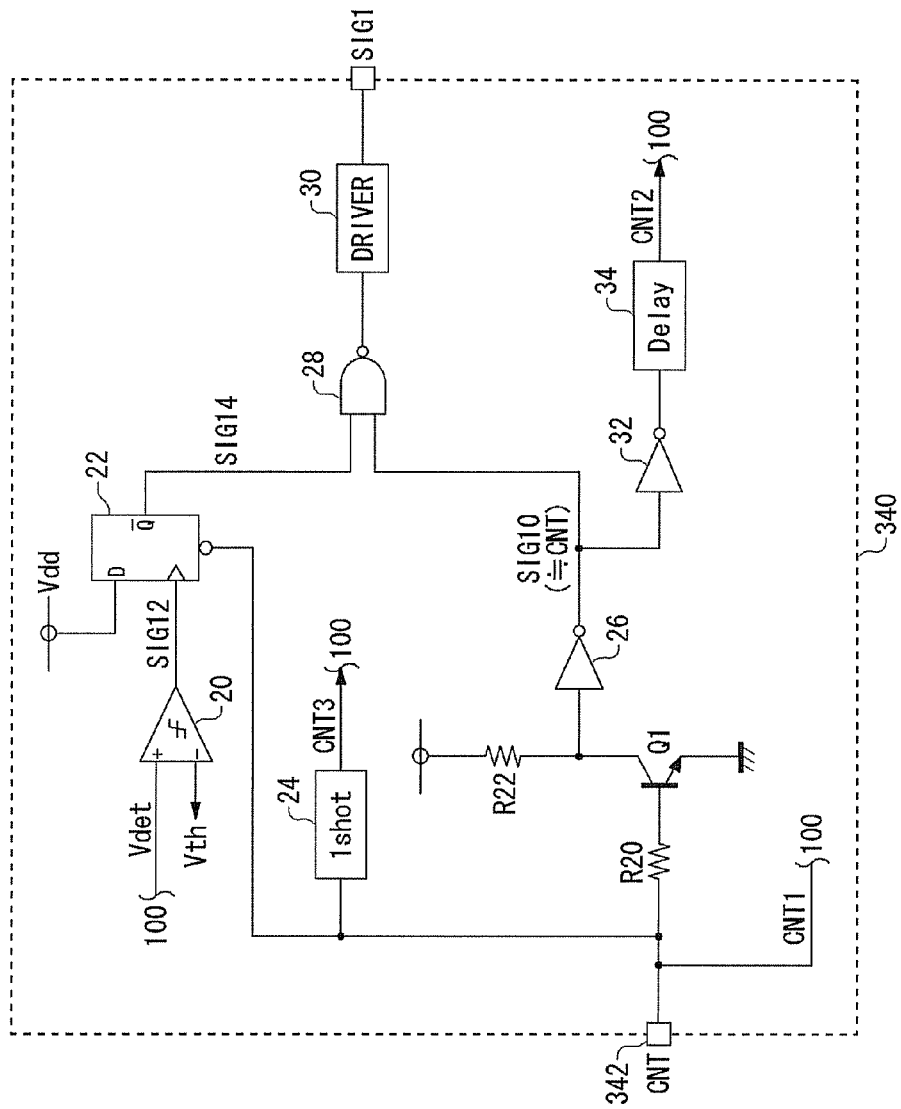
FIG. 3 is a circuit diagram showing a configuration of a light emission control unit in FIG. 1.

Next, a configuration of the light emission control unit 340 will be described. FIG. 3 is a circuit diagram showing the configuration of the light emission control unit 340 according to the embodiment. The light emission control unit 340 includes a comparator 20, a D-latch circuit 22, a one-shot circuit 24, a first inverter 26, an NAND gate 28, a driver circuit 30, a second inverter 32, and a delay circuit 34.

The light emission control unit 340 generates the first to third control signals CNT1 to CNT3 according to the control signal CNT input to a control terminal 342, in which a signal level varies prior to start of light reception of the phototransistor 210, and outputs the signals to the current detection circuit 100. Further, the light emission control unit 340 generates the light emission control signal SIG1 according to the control signal CNT and the detection voltage Vdet output from the current detection circuit 100, and controls the light emission and the stop of light emission of the light emitting device 330.

First, a block that generates the first to third control signals CNT1 to CNT3 in the light emission control unit 340 will be described.

The control signal CNT input to the control terminal 342 is output as the first control signal CNT1 without change to the current detection circuit 100.

The second control signal CNT2 is generated by delaying the control signal CNT with resistors R20 and R22, the transistor Q1, the first inverter 26, the second inverter 32, and the delay circuit 34. The transistor Q1 is an NPN-type bipolar transistor, emitter-grounded, and provided with the resistor R22 between the collector and the power supply line. The resistor R20 is connected between the base of the transistor Q1 and the control terminal 342.

The resistors R20 and R22 and the transistor Q1 logically invert the control signal CNT and output it. The first inverter 26 logically inverts the inverted control signal CNT again.

Output signal SIG10 of the first inverter 26 is input to the second inverter 32. The second inverter 32 logically inverts the output signal SIG10 of the first inverter 26 and outputs it to the delay circuit 34. The delay circuit 34 delays the output signal of the second inverter 32 by the predetermined time ΔT1. The signal output from the delay circuit 34 is output as the second control signal CNT2 to the current detection circuit 100. For example, the delay time ΔT1 by the delay circuit 34 is set to about 5 μs.

The control signal CNT in which the signal level varies prior to start of light reception of the phototransistor 210 is input to the one-shot circuit 24. The one-shot circuit 24 generates the third control signal CNT3 at the high level for a period of predetermined time ΔT2 after the control signal CNT reaches the high level. That is, the one-shot circuit 24 is a latch circuit that latches the control signal CNT for a period of the predetermined time ΔT2. The third control signal CNT3 is output to the bias switch SW1 and controls the on and off thereof. The predetermined time ΔT2 is longer than the delay time ΔT1, and set to about 10 μs, for example.

The light emission control unit 340 configured as above generates the first to third control signals CNT1 to CNT3 and outputs them to the current detection circuit 100.

Next, a block that generates the light emission signal SIG1 for controlling the light emission of the light emitting device 330 in the light emission control unit 340 will be described. This block includes the comparator 20, the D-latch circuit 22, the NAND gate 28, and the driver circuit 30.

The comparator 20 compares the detection voltage Vdet output from the current detection circuit 100 with the predetermined threshold voltage Vth, and outputs comparison signal SIG12 at the high level for Vdet>Vth and at the low level for Vdet<Vth.

The comparison signal SIG12 output from the comparator 20 is input to the clock terminal of the D-latch circuit 22. The data terminal of the D-latch circuit 22 is connected to the power supply line and fixed at the high level. The control signal CNT is input to the reset terminal of the D-latch circuit 22. The D-latch circuit 22 functions as a latch circuit that is set by the positive edge of the comparison signal SIG12 and reset by the negative edge of the control signal CNT. The inverted output signal SIG14 of the D-latch circuit 22 is output to the NAND gate 28.

The NAND gate 28 outputs negative AND of the output signal SIG10 of the first inverter 26 and the inverted output signal SIG14 of the D-latch circuit 22. The driver circuit 30 outputs the light emission control signal SIG1 at the high level in a period in which the output signal of the NAND gate 28 is at the low level.

Figure 4:
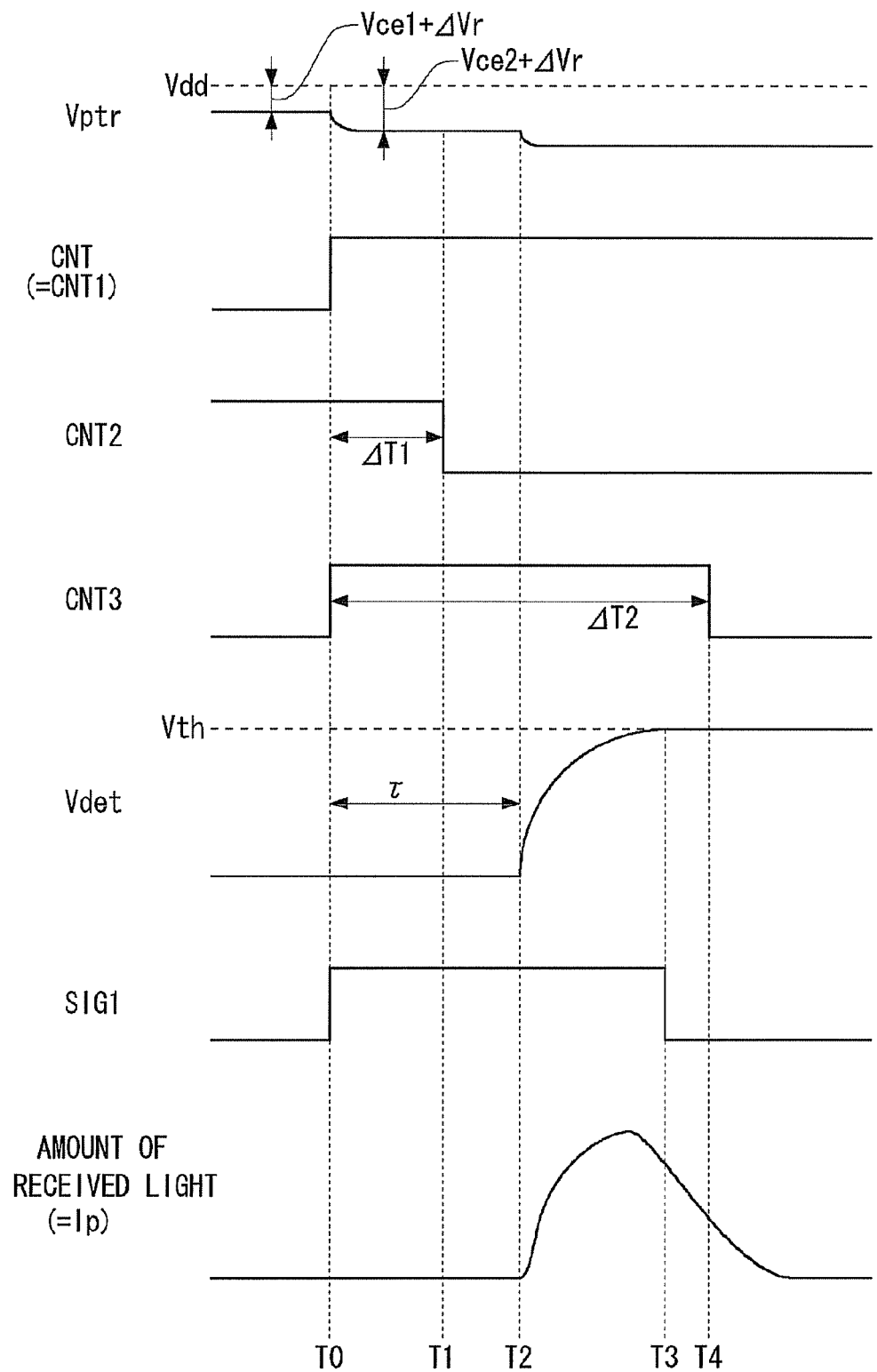
FIG. 4 is a time chart showing an operation condition of the electronic equipment in FIG. 1.

The operation of the current detection circuit 100 in FIG. 2 and the light emission control unit 340 in FIG. 3 configured as above will be described. FIG. 4 is a time chart showing the operation condition of the current detection circuit 100 and the electronic equipment 300 according to the embodiment.

Before time T0, power supply voltage Vdd has risen and the current detection circuit 100 is in a standby state. In this period, very small photocurrent Ip (dark current) flows in the phototransistor 210. The photocurrent Ip flows in the first transistor Q1 as first current Iq1. Since the base and collector of the first transistor Q1 are connected, collector-emitter voltage Vce is equal to base-emitter voltage Vbe. The potential Vptr of the detection terminal 102 appears as a voltage (Vdd−Vce−ΔVr) lower by the collector-emitter voltage Vce (=base-emitter voltage Vbe) of the first transistor Q1 and voltage drop ΔVr in the first resistor R10 than the power supply voltage Vdd. Since the photocurrent Ip flowing in the phototransistor 210 is small, the collector-emitter voltage Vce of the first transistor Q1 is small.

At time T0, the control signal CNT reaches the high level, and the light emission of the light emitting device 330 is instructed. As described above, the first control signal CNT1 reaches the high level at the same time when the control signal CNT1 reaches the high level. Further, the third control signal CNT3 output from the one-shot circuit 24 is at the high level for a period of predetermined time ΔT2 from time T1.

When the first control signal CNT1 reaches the high level at the time T0, the bypass switch SW2 turns on and the second bias resistor Rbias2 is bypassed. Further, when the third control signal CNT3 reaches the high level, the bias switch SW1 turns on and the bias current Ibias flows in the bias current path 12.

Simultaneously, the current Iq1 flowing in the first transistor Q1 becomes the sum (Ip+Ibias) of the photocurrent Ip and the bias current Ibias. As described above, since the resistance value of the first bias resistor Rbias1 is set sufficiently lower than the resistance value of the second bias resistor Rbias2, the first current Iq1 flowing in the first transistor Q1 increases. Consequently, the collector-emitter voltage Vce of the first transistor Q1 becomes larger than that in the period before the time T0, and the potential Vptr of the detection terminal 102 becomes lower.

At the time T0 prior to the start of light reception of the light emitting device 330, the bypass switch SW2 is turned on and the bias current Ibias is flown in the bias current path 12, and the first current Iq1 increases. The increase of the first current Iq1 means that the collector current Ice of the first transistor Q1 increases.

Figure 5:
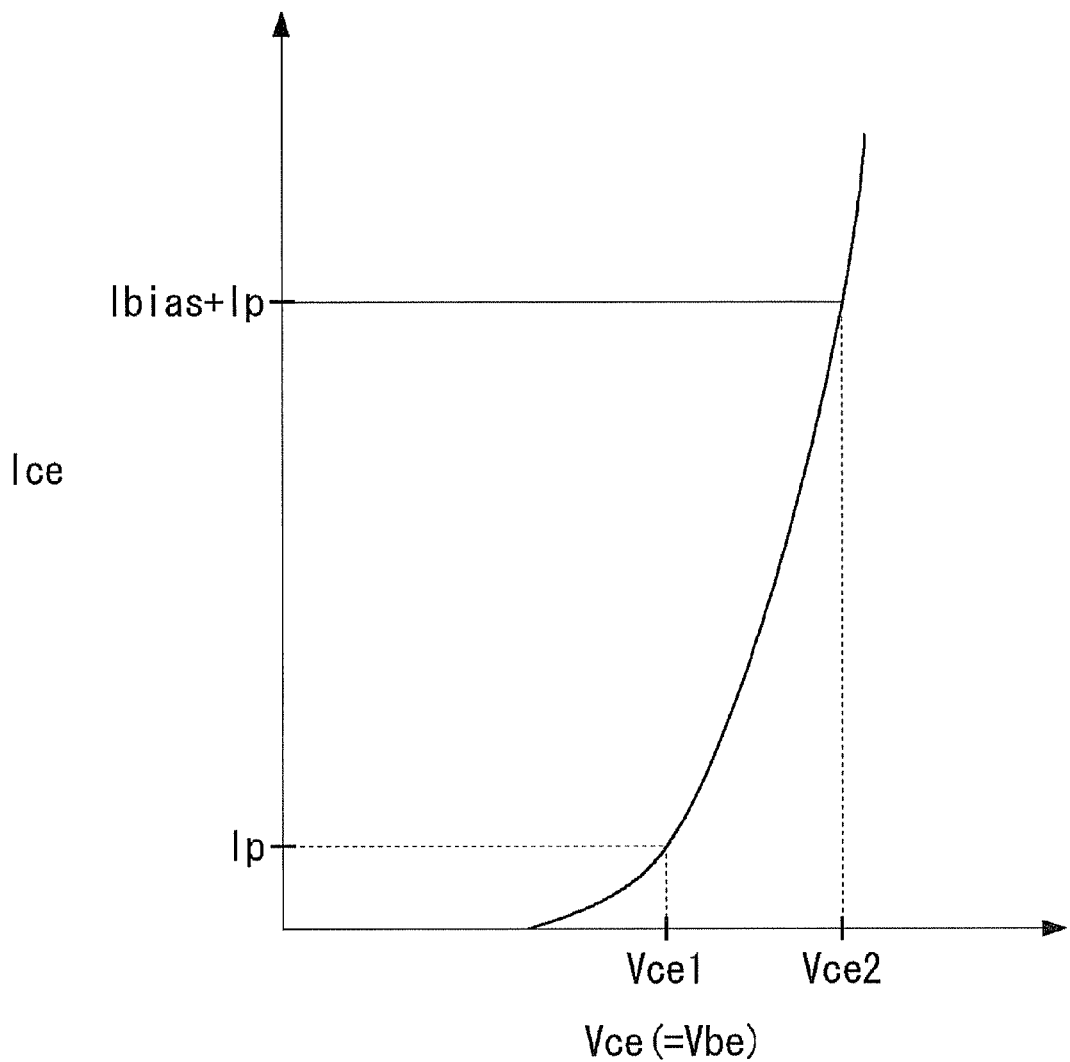
FIG. 5 is a diagram showing a current characteristic of the first transistor as a bipolar transistor.

FIG. 5 shows a current characteristic of the first transistor Q1 as a bipolar transistor. The vertical axis of the same drawing indicates collector current Ice (=Iq1), and the horizontal axis indicates collector-emitter voltage Vce (=base-emitter voltage Vbe). As shown in FIG. 5, when the collector current Ice (=Iq1) is small, the fluctuation range of the collector-emitter voltage Vce relative to the fluctuation of the collector current Ice is large, and, as the collector current Ice becomes larger, the fluctuation range thereof becomes smaller.

Therefore, when the first current Iq1 (collector current Ice) is small as before the time T0, if the first current Iq1 slightly changes, the collector voltage of the first transistor Q1, and thus, the voltage Vptr of the detection terminal 102 fluctuates. If the voltage Vptr of the detection terminal 102 fluctuates, the bias state of the phototransistor 210 changes and the photocurrent Ip may fluctuate. Further, the fluctuation of the voltage of the detection terminal 102 may deteriorate the characteristic of the current mirror circuit including the first transistor Q1 and the second transistor Q2.

Accordingly, in the current detection circuit 100 according to the embodiment, at the time T0 prior to the start of light reception, the bias switch SW1 is turned on and the first current Iq1 is increased. Consequently, the first transistor Q1 is biased in the constant current region, the amount of change of the collector-emitter voltage Vce relative to the amount of change of the collector current Ice becomes smaller, and the voltage Vptr of the detection terminal 102 can be held constant. When the voltage Vptr of the detection terminal 102 is held constant, the characteristic of the phototransistor 210 can be held constant and the characteristic of the current mirror circuit including the first transistor Q1 and the second transistor Q2 can be held good.

Further, the second control signal CNT2 is latched and maintained at the high level from the time T0 when the control signal CNT transits from the low level to the high level to the time T1 after the predetermined time ΔT1 has elapsed. In the period when the second control signal CNT2 is at the high level, the discharge switch SW4 turns on, and the charge accumulated in the charging capacitor Cchg is discharged and initialized. Furthermore, while the second control signal CNT2 is at the high level, the mask switch SW3 turns off, and the path of the second current Iq2 is shut. Consequently, the charging capacitor Cchg is not charged and the detection voltage Vdet is fixed at the ground potential before the time T1 even when light enters the light emitting device 330 and photocurrent IP flows. Since the circuit current is shut, the power consumption can be made lower.

At the time T0, the light emission control signal SIG1 reaches the high level, and the light emitting device 330 is in the light emittable state. The light emitting device 330 according to the embodiment emits light with the delay of time τ after the light emission control signal SIG1 reaches the high level. Therefore, it is necessary to set the above-described predetermined time ΔT1 shorter than the time τ.

At the time T1, when the second control signal CNT2 reaches the low level, the mask switch SW3 turns on, the discharge switch SW4 turns off, and the current detection circuit 100 turns into the standby state.

At time T2 after time τ has elapsed from the time T0 when the light emission control signal SIG1 reaches the high level, the light emitting device 330 emits light. When the light emitting device 330 emits light, the reflected light enters the phototransistor 210 and the photocurrent Ip flows. At the time T2, the bias current path 12 is off, and the first current Iq1 flowing in the first transistor Q1 is equal to the photocurrent Ip. As described above, the first transistor Q1 is biased in the constant current region, and thereby, the potential Vptr of the detection terminal 102 hardly fluctuates even when the photocurrent Ip starts to flow.

After the time T2, the charging capacitor Cchg is charged by the second current Iq2 output from the second transistor Q2, and the detection voltage Vdet gradually rises. At time T3, when the detection voltage Vdet reaches the voltage of predetermined threshold value Vth, the comparison signal SIG12 output from the comparator 20 reaches the high level and the inverted output signal SIG14 of the D-latch circuit 22 reaches the low level. Consequently, the light emission control signal SIG1 output from the driver circuit 30 reaches the low level, the light emission control transistor 350 turns off, and the light emission of the light emitting device 330 stops.

Then, at time T4 after the predetermined time ΔT2 has elapsed from the time T0, the third control signal CNT3 reaches the low level and the bias switch SW1 turns off.

According to the current detection circuit 100 of the embodiment, the first transistor Q1 that forms the current mirror circuit can be biased in the constant current region by turning on the bias switch SW1 prior to the start of light emission of the light emitting device 330, that is, the start of light reception by the phototransistor 210. Furthermore, as result, the collector voltage of the phototransistor 210, that is, the potential Vptr of the detection terminal 102 can be held nearly at the constant value regardless of the value of the photocurrent Ip, and stable photodetection can be performed.

Further, the second bias resistor Rbias2 is provided, and thereby, the impedance of the main current path 10 can be made higher in the period before the start of light reception, and the current consumption of the circuit can be reduced.

Figure 6:
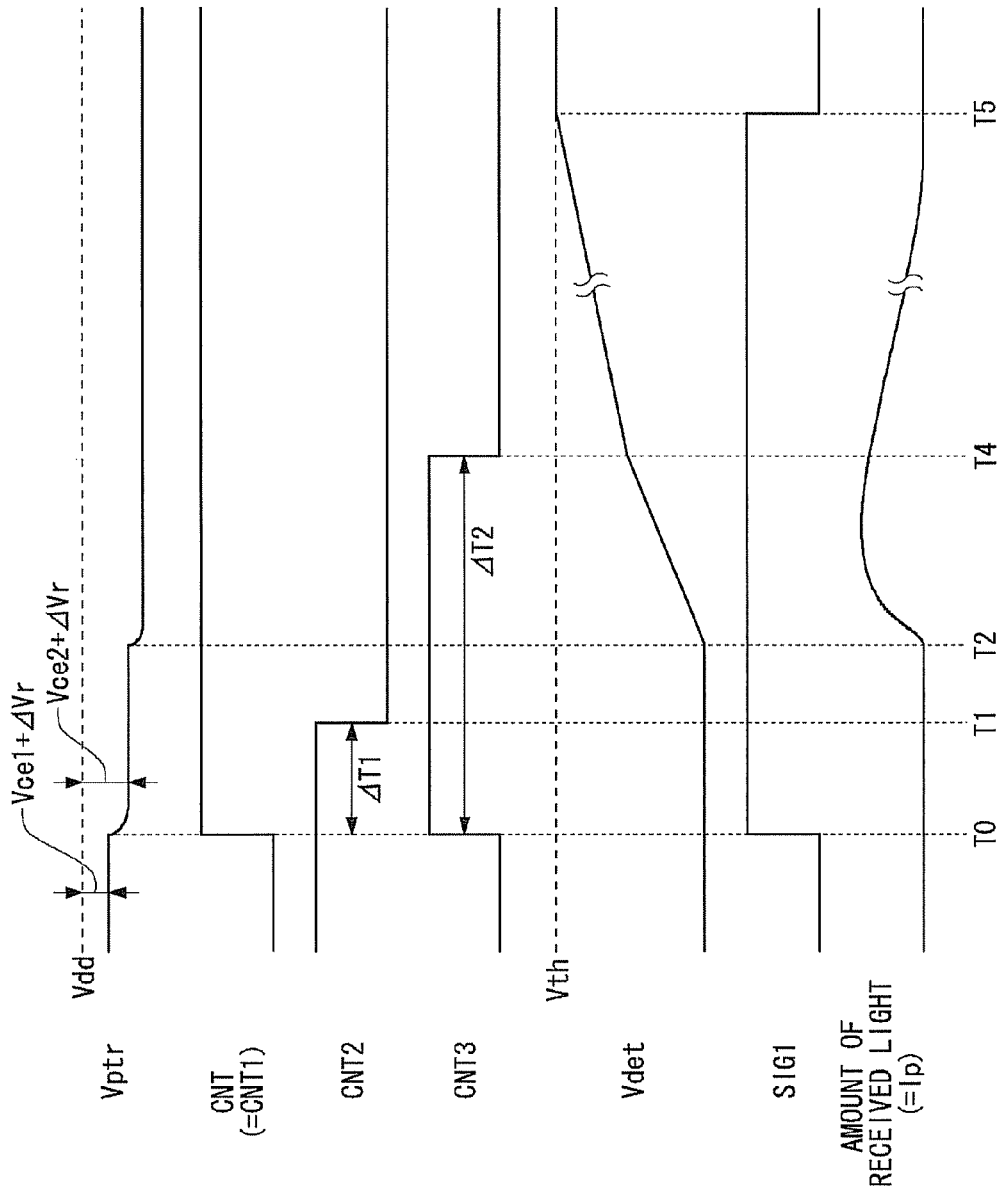
FIG. 6 is a time chart showing an operation condition of a current detection circuit and the electronic equipment when the amount of light received by a phototransistor is small.

FIG. 6 is a time chart showing the operation condition of the current detection circuit 100 and the electronic equipment 300 when the amount of light received by the phototransistor 210 is small.

The waveform before the start of light reception by the phototransistor 210, namely, from the time T0 to the time T2 is the same as that in FIG. 4. At the time T2 after time τ has elapsed from the time T0 when the light emission control signal SIG1 reaches the high level, the light emitting device 330 emits light. When the distance from the light emitting device 330 to the reflector is long, the intensity of reflected light becomes weak and the amount of received light becomes small. Consequently, the photocurrent Ip becomes smaller than that in the case of FIG. 4, and the rising speed of the detection voltage Vdet become slower. In the period from the time T2 to the time T4, the first current Iq1 flowing in the first transistor Q1 is the sum current of the photocurrent Ip and the bias current Ibias.

The third control signal CNT3 reaches the low level at the time T3 after the predetermined time ΔT2 has elapsed from the time T0. When the third control signal CNT3 reaches the low level, the bias switch SW1 turns off and the bias current path 12 turns off. After the time T4, when the bias switch SW1 turns off, the bias current Ibias no longer flows, and therefore, the first current Iq1 flowing in the first transistor Q1 is equal to the photocurrent Ip. Consequently, the charging current for the charging capacitor Chg decreases and the rising speed of the detection voltage Vdet becomes lower.

Then, at time T5, when the detection voltage Vdet reaches the threshold voltage Vth, the light emission control signal SIG1 reaches the low level and the light emission of the light emitting device 330 stops.

The fact that a predetermined period has elapsed after the phototransistor 210 starts to receive light (corresponding to ΔT2-τ in the embodiment) means that the rising speed of the detection voltage Vdet is slow, and therefore, the photocurrent Ip is small. When the photocurrent Ip is about equal to or lower than the bias current Ibias, if the charging capacitor Cchg is charged based on the first current Iq1 (=Ip+Ibias), the amount of received light can not be accurately integrated.

Accordingly, the light receiver 200 and the light emission control unit 340 can accurately detect the amount of received light and preferably control the time until the light emitting device 330 is turned off by turning off the bias switch SW1 after the predetermined time (ΔT2-τ) has elapsed to set the first current Iq1 equal to the photocurrent Ip.

At the time T4, since the photocurrent Ip flows in the first transistor Q1, even when the bias current Ibias is turned off, the bias state of the first transistor Q1 does not drop to the non-constant current region and the potential Vptr of the detection terminal 102 does not drastically fluctuates.

Furthermore, according to the light receiver 200 and the light emission control unit 340 of the embodiment, the following effects can be obtained by providing the discharge switch SW4 and the mask switch SW3.

When the power supply voltage is provided to the current detection circuit 100, the phototransistor 210 is biased, and thereby, the charging capacitor Cchg may be charged because dark current flows or photocurrent Ip flows due to light incident from outside that should not be received. Accordingly, charging of the charging capacitor Cchg by unwanted current can be prevented by turning on the discharge switch SW4 for the predetermined period prior to the start of light reception of the phototransistor 210. Further, the detection voltage Vdet can be set to the initial value by discharging the charge accumulated in the charging capacitor Cchg. Furthermore, the mask switch SW3 has been turned off prior to the start of light reception of the phototransistor 210, and thereby, the charging capacitor Cchg can be prevented from being charged by the second current Iq2 and the current consumption of the circuit can be reduced.

Moreover, since the comparison signal SIG12 output from the comparator 20 is latched using the D-latch circuit 22, the light emission control signal SIG1 can be prevented from alternating between the high level and the low level, and thus, the light emitting device 330 can be prevented from alternating between light emission and the stop of light emission when the detection voltage Vdet fluctuates near the threshold voltage Vth.

Figure 7:
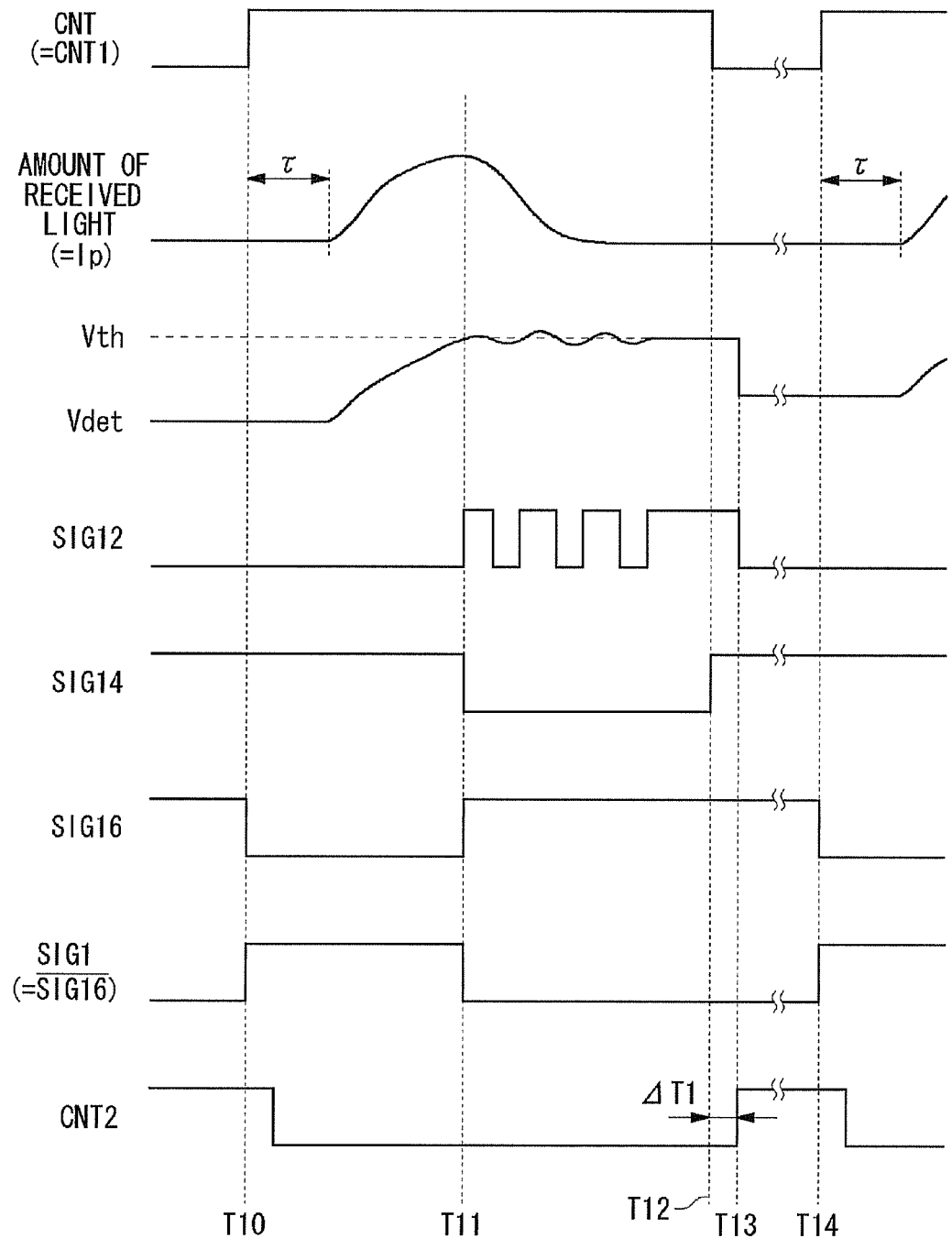
FIG. 7 is a time chart showing an operation of a light emission controller when the light emission of a light emitting device is stopped.

FIG. 7 is a time chart showing the operation of the light emission controller 302 according to the embodiment when the light emission of the light emitting device 330 is stopped. Before time T10 when the control signal CNT reaches the high level, the D-latch circuit 22 has been reset and the inverted output signal SIG14 has reached the high level. Simultaneously, the output signal SIG16 of the NAND gate 28 is at the high level and the light emission control signal SIG1 is at the low level.

When the control signal CNT reaches the high level at the time T10, the output signal SIG16 of the NAND gate 28 reaches the low level, the light emission control signal SIG1 reaches the high level, and the light emission control transistor 350 turns on. After a period of time, the light emitting device 330 emits light.

When the light emitting device 330 emits light, the detection voltage Vdet output from the light receiver 200 starts to rise. At time T11, when the detection voltage Vdet reaches the threshold voltage Vth, the comparison signal SIG12 output from the comparator 20 reaches the high level and the inverted output signal SIG14 of the D-latch circuit 22 reaches the low level.

When the inverted output signal SIG14 of the D-latch circuit 22 reaches the low level, the output signal SIG16 of the NAND gate 28 reaches the high level, the light emission control signal SIG1 reaches the low level, the light emission control transistor 350 turns off, and the light emission of the light emitting device 330 stops.

The inverted output signal SIG14 of the D-latch circuit 22 holds the low level for a period after the comparison signal SIG12 is latched at the time T11 and before the negative edge of the control signal CNT is reset. Consequently, even when the detection voltage Vdet fluctuates and the comparison signal SIG12 fluctuates, the light emission of the light emitting device 330 can be continued to be stopped.

At time T12, when the control signal CNT transits from the high level to the low level, the D-latch circuit 22 is reset and the inverted output signal SIG14 reaches the high level. In the period from the time T12 to time T13, the light emission control signal SIG1 is at the low level. Further, at the T13 after the predetermined time ΔT1 has elapsed from the time T12, the second control signal CNT2 as the output signal of the delay circuit 34 reaches the high level. When the second control signal CNT2 reaches the high level, the discharge switch SW4 turns on and the detection voltage Vdet is initialized to the ground potential. Then, at time T14, the control signal CNT reaches the high level and the next light emission is instructed.

As described above, according to the light emission controller 302 of the embodiment, since the comparison signal SIG12 output from the comparator 20 is latched using the D-latch circuit 22, the light emission control signal SIG1 can be prevented from alternating between the high level and the low level, and thus, the light emitting device 330 can be prevented from alternating between light emission and the stop of light emission when the detection voltage Vdet fluctuates near the threshold voltage Vth.

Further, the D-latch circuit 22 is reset by the negative edge of the control signal CNT, and thereby, the device can be returned to the light emittable state before the positive edge of the control signal CNT corresponding to the light emission instruction is input at the next time.

It will be understood by a person skilled in the art that the above-described embodiment is an illustration, various modifications can be made to combinations of those respective components and the respective processing processes, and further, the modifications are within the scope of the invention.

In the embodiment, the bias current path 12 is configured by connecting the first bias resistor Rbias1 and the bias switch SW1 in series, however, not limited to that, a constant current source that generates predetermined current may be used. In this case, the bias state of the first transistor Q1 can be changed by turning on and off the constant current source.

In the embodiment, the comparison signal SIG12 output from the comparator 20 is latched by the D-latch circuit 22, however, not limited to that, a D-flip-flop may be used. Further, an RS-flip-flop that is set by the comparison signal SIG12 and reset by the negative edge of the control signal CNT may be used. Using either one, the same effect as that of the case of using the D-latch circuit 22 can be obtained.

In the embodiment, the bias current path 12 is configured by connecting the first bias resistor Rbias1 and the bias switch SW1 in series, however, not limited to that, a constant current source that generates predetermined current may be used. In this case, the bias state of the first transistor Q1 can be changed by turning on and off the constant current source.

In the embodiment, the phototransistor 210 is used as the light receiving device, however, a photodiode may be used instead.

In the embodiment, the elements configured by MOSFET, bipolar transistor may be mutually replaced. The selection of them may be determined according to the semiconductor manufacturing process, costs, use required for circuits. Furthermore, a circuit configuration in which the power supply voltage and the ground potential are vertically inverted, and the PNP transistor and the NPN transistor or PMOS transistor and NMOS transistor are replaced may be effective.

In the embodiment, the case where the light receiver 200 and the light emission control unit 340 are integrated as a unit is described, however, they are partly configured by discrete components. Which part is integrated may be determined according to costs, occupied area, application, or the like.

As the electronic equipment 300 using the current detection circuit 100 or the light receiver 200 according to the embodiment, not limited to the above-described cellular phone terminal, they may be widely used for equipment such as an illuminance sensor, an infrared remote control for detecting light using a photodiode or phototransistor.

While the preferred embodiments of the present invention have been described using specific terms, such description is for illustrative purposes only, and it is to be understood that changes and variations may be made without departing from the spirit or scope of the appended claims.

What is claimed is:

1. A current detection circuit for detecting current flowing in a light receiving device connected to a detection terminal, the current detection circuit comprising:
   a first transistor, one end thereof connected to a first end of a main current path including the light receiving device and the detection terminal, a potential of a second end of the main current path being fixed;
   a bias current path which is on-off controllable, a first end thereof connected to the first end of the main current path, a second end thereof connected to the second end of the main current path; and
   a second transistor which configures a current mirror circuit with the first transistor and forms output of the current detection circuit by multiplying the current flowing in the first transistor by a predetermined factor, wherein
   the bias current path is configured to turn on prior to the start of light reception of the light receiving device, and
   a sum of the current through the main current path and the current through the bias current path flows into the first transistor.

2. The current detection circuit according to claim 1, wherein
   the bias current path turns off after a predetermined period has elapsed from the start of light reception of the light receiving device.

3. The current detection circuit according to claim 2, further comprising a latch circuit which latches a control signal in which a signal level varies prior to the start of light reception of the light receiving device for a predetermined period, wherein
    an output signal of the latch circuit is a signal for controlling on and off of the bias current path.

4. The current detection circuit according to claim 1, wherein
    the bias current path includes a first bias resistor and a bias switch connected in series.

5. The current detection circuit according to claim 1, further comprising a second bias resistor which is provided between the first transistor and the detection terminal on the main current path.

6. The current detection circuit according to claim 5, further comprising a bypass switch which bypasses the second bias resistor, wherein
    the bypass switch turns on prior to the start of light reception of the light receiving device.

7. The current detection circuit according to claim 1, wherein
    the circuit charges the current flowing in the second transistor in a capacitance, converts the current into a voltage, and outputs the voltage.

8. The current detection circuit according to claim 1, wherein
    the circuit is integrated on one semiconductor substrate.

9. A light receiver comprising:
    the current detection circuit according to claim 1; and
    a light receiving device which is connected to the detection terminal of the current detection circuit.

10. The light receiver according to claim 9, wherein the light receiving device is a phototransistor.

11. The light receiver according to claim 9, wherein the light receiving device is a photodiode.

12. An electronic equipment comprising:
    a light emitting device; and
    the light receiver according to claim 9 which detects light emitted from the light emitting device and reflected by an object outside.

13. The electronic equipment according to claim 12, wherein
    the light emitting device stops light emission when an amount of light of reflected light detected by the light receiver reaches a predetermined value.

14. A current detection circuit for detecting current flowing in a light receiving device, comprising:
    a first transistor which is provided on a current path of the light receiving device in series with the light receiving device;
    a charging capacitor with a potential at one end fixed;
    a second transistor which configures a current mirror circuit with the first transistor, multiplies the current flowing in the first transistor by a predetermined factor, and charges the charging capacitor; and
    a discharge switch which is provided in parallel with the charging capacitor,
wherein
    the discharge switch is configured to turn on for a predetermined period prior to the start of light reception of the light receiving device, and
    a current flowing in the light receiving device flows into an emitter, a source, a collector, or a drain of the first transistor.

15. The current detection circuit according to claim 14, further comprising a mask switch provided on the current path including the second transistor and the charging capacitor, wherein
    the mask switch turns off for a predetermined period prior to the start of light reception of the light receiving device.

16. The current detection circuit according to claim 15, wherein
    on and off of the discharge switch and the mask switch are controlled according to the same signal.

17. The current detection circuit according to claim 16, further comprising a delay circuit which delays a control signal in which a signal level varies prior to the start of light reception of the light receiving device, wherein
    an output signal of the delay circuit is a signal for controlling on and off of the discharge switch and the mask switch.

18. The current detection circuit according to claim 14, wherein
    the circuit is integrated on one semiconductor substrate.

19. A light receiver comprising:
    a light receiving device; and
    the current detection circuit according to claim 14 which detects photocurrent flowing in the light receiving device.

20. The light receiver according to claim 19, wherein the light receiving device is a phototransistor.

21. The light receiver according to claim 19, wherein the light receiving device is a photodiode.

22. An electronic equipment comprising:
    a light emitting device; and
    the light receiver according to claim 19 which detects light emitted from the light emitting device and reflected by an object outside.

23. The electronic equipment according to claim 22, wherein
    the light emitting device stops light emission when an amount of light of reflected light detected by the light receiver reaches a predetermined value.

* * * * *